United States Patent [19]

LaBarge et al.

[11] Patent Number: 4,885,582

[45] Date of Patent: Dec. 5, 1989

[54] "SIMPLE CODE" ENCODER/DECODER

[75] Inventors: Steven B. LaBarge, Grass Valley; Bruce Waggoner, Nevada City, both of Calif.

[73] Assignee: The Grass Valley Group, Inc., Nevada City, Calif.

[21] Appl. No.: 101,905

[22] Filed: Sep. 28, 1987

[51] Int. Cl.[4] .............................................. H03M 5/18
[52] U.S. Cl. ......................................... 341/57; 341/73
[58] Field of Search ......................... 341/56, 57, 68, 73

[56] References Cited

U.S. PATENT DOCUMENTS

| | | | |
|---|---|---|---|
| 3,214,749 | 10/1965 | Karnaugh | 341/57 |
| 4,231,023 | 10/1980 | Warner | 341/57 |
| 4,243,976 | 1/1981 | Warner et al. | 341/57 |
| 4,244,051 | 1/1981 | Fujikura et al. | 341/57 |
| 4,442,528 | 4/1984 | Fukuda | 341/73 |
| 4,503,546 | 3/1985 | Yoshime et al. | 341/73 |

OTHER PUBLICATIONS

AT&T Technical Advisory No. 34 "Interconnection Specification for Digital Cross-Connects"—Issue 3, Oct. 1979.

Primary Examiner—William M. Shoop, Jr.
Assistant Examiner—Marc S. Hoff
Attorney, Agent, or Firm—Francis I. Gray

[57] ABSTRACT

A Simple Code encoder/decoder converts a ternary, or bipolar, signal having a strong clock component into a binary signal while maintaining the strong clock component for processing with digital equipment. The Simple Code is high for each positive value of the bipolar signal, low for each negative value of the bipolar signal, and alternates high/low for each zero value of the bipolar signal. The encoder uses an extractor circuit to generate a +PULSE signal, a −PULSE signal and a CLOCK signal from the bipolar signal. The +PULSE and CLOCK signals are combined to produce an intermediate binary signal, and the intermediate binary signal is combined with the −PULSE signal to produce the Simple Code binary signal. The decoder extracts the CLOCK signal from the Simple Code binary signal and uses the CLOCK signal to generate positive and negative pulse signals corresponding to the highs and lows of the binary signal of a duration equal to the period of the CLOCK signal. The positive and negative pulse signals are combined to produce the original bipolar signal.

7 Claims, 4 Drawing Sheets

"SIMPLE CODE" ENCODER/DECODER

BACKGROUND OF THE INVENTION

The present invention relates to data encoders/decoders, and more particularly to a "simple code" encoder/decoder to convert a ternary signal to a binary signal while retaining both the clock and data components of the ternary signal.

In telecommunications systems for transmitting digital data, such as that defined by Technical Advisory No. 34 by American Telephone and Telegraph Company Network Planning and Design Department of Basking Ridge, New Jersey, data is transmitted as a ternary signal in B3ZS format having an embedded clock signal and having three logic states —+1, 0, —1. This signal is essentially an analog signal which always has a strong clock component regardless of data pattern by replacing strings of data zeros with alternating polar pulses. This type of signal can be switched using wideband analog routers, but would be more desirable to use digital routers that are less sensitive to crosstalk and have lower crosspoints.

Other types of digital codes, such as Manchester code, convert a binary NRZ signal with no embedded clock component into a binary signal with an embedded clock component. However, Manchester code requires twice the bandwidth of the original NRZ signal, and for asynchronous data it requires a preamble to insure that clock recovery circuits can recover the correct clock phase relationship Thus prior techniques for encoding/decoding the DS3 signal require decoding the DS3 signal into NRZ and reencoding as another digital code having a strong clock component This results in a complex encoding/decoding circuitry.

What is desired is an encoding/decoding scheme which converts a ternary signal into an NRZ binary signal in a single transformation while retaining the clock and data components of the ternary signal.

SUMMARY OF THE INVENTION

Accordingly the present invention provides a "simple code" encoder/decoder for converting a ternary, or bipolar, signal having a strong clock component, such as a B3ZS encoded bipolar signal, to and from an NRZ binary code in a single transformation step while retaining the strong clock component. The coding rules provide that if the bipolar signal is positive, Simple Code is high. If the bipolar signal is negative, Simple Code is low. If the bipolar signal is zero, Simple Code is high for the first half of the bit interval and low for the second half. The positive, negative and clock signal components are extracted from the bipolar signal and input to a pair of NOR gates to produce the Simple Code output. In like manner the clock signal component is extracted from the Simple Code and input with the Simple Code into a pair of flip-flop chains, the outputs of which are combined by a summing network at the input of an output buffer amplifier to produce the ternary signal output.

The objects, advantages and novel features of the present invention will be apparent from the following detailed description when read in conjunction with the appended claims and attached drawing.

DESCRIPTION OF THE PREFERRED EMBODIMENT

Figure 1:
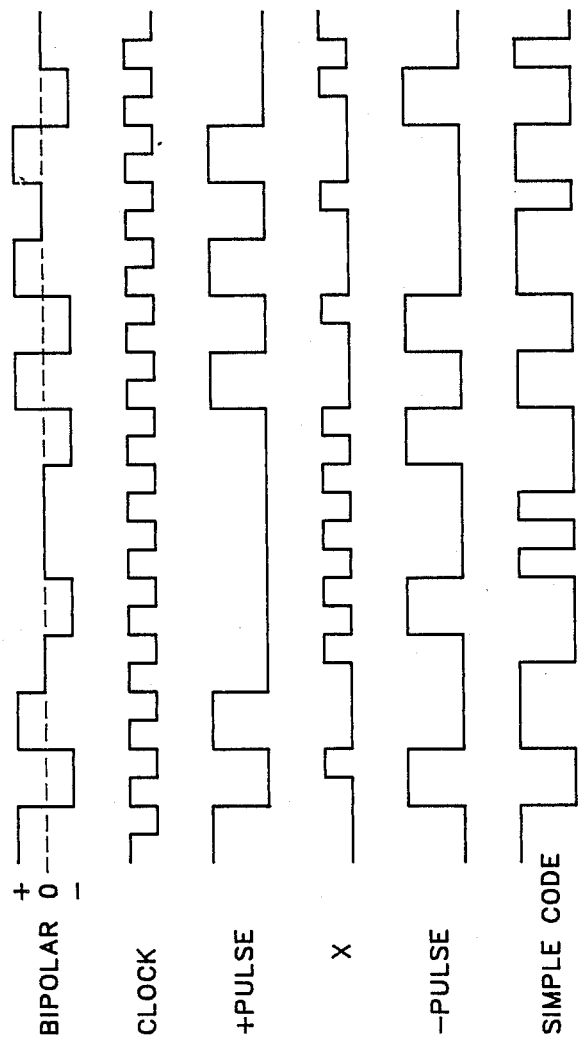
FIG. 1 is a timing diagram showing the conversion of a bipolar signal to a binary Simple Code according to the present invention.
Figure 2:
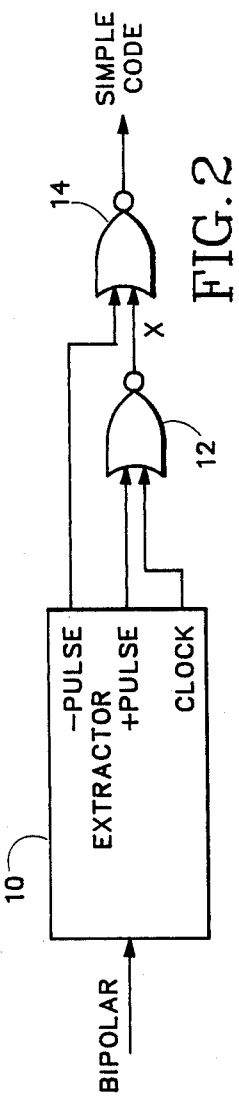
FIG. 2 is a simple block diagram of a ternary to Simple Code encoder according to the present invention.

Referring now to FIGS. 1 and 2 a ternary, or bipolar, signal, such as a B3ZS bipolar encoded signal having a strong clock component and three states —+1, 0, —1 —, is input to an extractor circuit 10. The bipolar signal may be separated into a positive pulse signal +PULSE, a negative pulse signal —PULSE and a clock signal CLOCK. The +ULSE signal is high when the bipolar signal state is +1 and low elsewhere; the —PULSE signal is high when the bipolar signal L state is —1 and low elsewhere; and the CLOCK signal has a leading edge coincident with each transition of the bipolar signal. The +PULSE and CLOCK signals are combined by a first NOR gate 12 to produce an intermediate signal X that is in turn input together with the —PULSE signal to a second NOR gate 14. The output of the second NOR gate 14 is an NRZ binary signal, i.e., Simple Code that conforms to the rules of being high when the bipolar signal is +1, low when the bipolar signal is —1, and alternating between high and low when the bipolar signal is zero.

Figure 3:
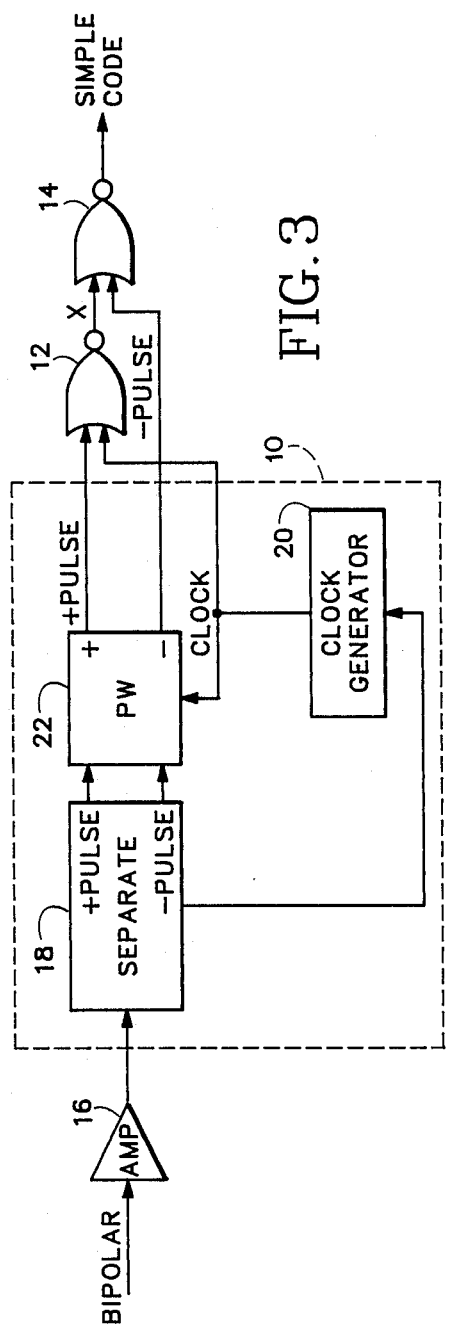
FIG. 3 is a detailed block diagram for the Simple Code encoder of FIG. 2.

As shown in FIG. 3 the bipolar signal is input to a linear amplifier 16 having appropriate filtering to compensate for transmission losses. The output of the linear amplifier 16 is input to a separator circuit 18 that outputs two binary signals, one representative of the +1 portion of the bipolar signal and the other representative of the —1 portion of the bipolar signal. Also output from the separator circuit 18 is a combined signal that is input to synchronize a clock generator 20. The pulses of the binary signals from the separator circuit 18 have a pulse width less than the clock cycle so that, when combined, each leading edge provides a trigger pulse to the clock generator 20. Further to provide the +PULSE and —PULSE signals having full pulse widths equal to the clock cycle, the binary signals from the separator circuit 18 are input to a pulse width circuit 22 that is triggered by the CLOCK signal from the clock generator 20. The outputs from the pulse width circuit 22 are the +PULSE and —PULSE signals. The clock cycle of CLOCK has a period equal to the pulse width of the input bipolar signal, i.e., if in the DS3 format the bipolar signal has a strong 22 MHz component, the clock frequency is 44 MHz. The outputs of the clock generator 20 and the pulse width circuit 22 are input to the respective NOR gates 12, 14 as described with respect to FIG. 1.

Figure 4:
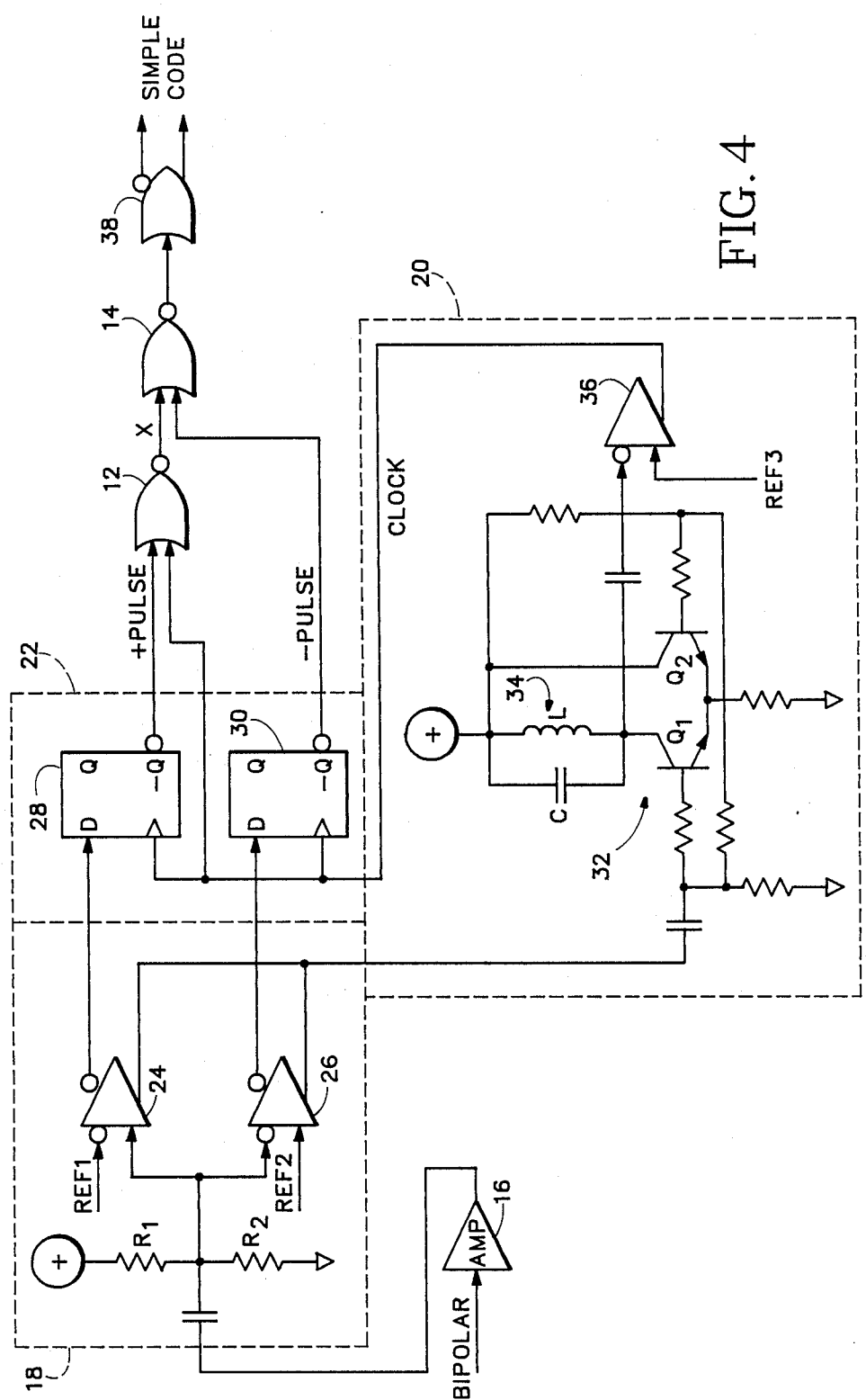
FIG. 4 is a schematic diagram for the Simple Code encoder of FIG. 3.

The output of the amplifier 16, as is shown in greater detail in FIG. 4, is a.c. coupled to a bias network of resistors R1, R2 to level shift the bipolar signal from zero volts d.c. to a d.c. level between the voltage rails of the circuit power supply. The level shifted bipolar signal is input to respective differential comparators 24, 26 where it is compared respectively with a first reference voltage REF1, having a value between the positive rail and the d.c. level, and with a second reference voltage REF2, having a value between the negative rail and the d.c. level. The differential outputs of the comparators 24, 26 provide on the inverted output a series of pulses corresponding to the +1 and −1 values of the bipolar signal, respectively. The noninverted outputs of the comparators 24, 26 are tied together to provide a series of pulses that is the logical "OR" combination of the +1 and −1 value pulses of the bipolar signal. The pulse widths of the comparator outputs are less than one clock cycle in duration Therefore the inverted outputs are input to respective D-type flip-flops 28, 30 that are clocked by the CLOCK signal from the clock generator 20 to produce at the /Q outputs the +PULSE and −PULSE signals, respectively, with the pulses having a width equal to the period of the CLOCK signal.

The positive pulse outputs from the comparators 24, 26 serve as sync pulses for the clock generator 20. The positive pulse outputs are a.c. coupled to an oscillator 32 having transistors Q1, Q2, an appropriate resistive biasing network, and an LC tank circuit in the collector circuit of Q1. The sine wave output from the oscillator 32 is a.c. coupled to a third comparator 36 for conversion into the CLOCK signal. A third reference voltage REF3, having a value approximately equal to the zero crossing value of the sine wave, provides a positive pulse at the output for the positive portion of the sine wave input having a pulse width equal to one-half the period of the CLOCK signal The resulting CLOCK signal from the clock generator 20 is combined with the +PULSE and −PULSE signals by NOR gates 12, 14 as described above. The resulting Simple Code output is input to an output buffer amplifier 38 to provide a differential Simple Code output for transmission.

Figure 5:
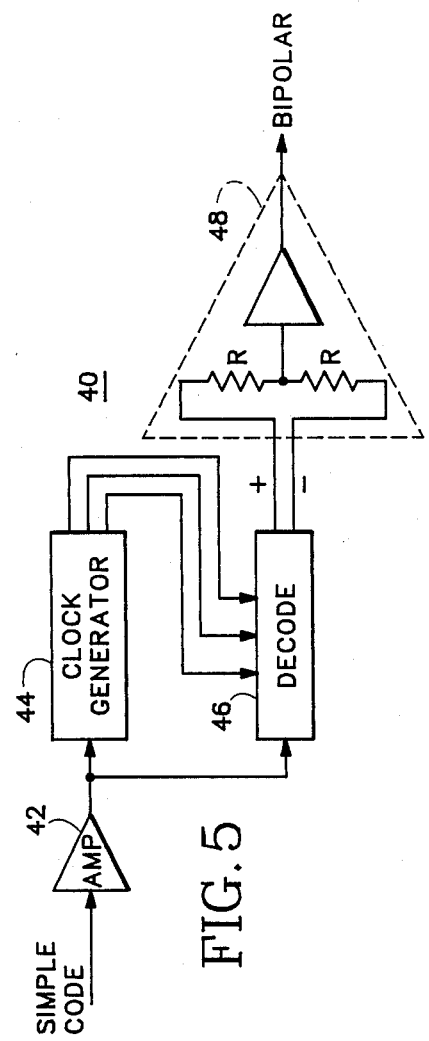
FIG. 5 is a detailed block diagram for a Simple Code to ternary signal decoder according to the present invention.

At the receiving end a decoder 40 shown in FIG. 5 has an input buffer amplifier 42 that receives the transmitted Simple Code. The output of the amplifier 42 is input to a clock generator 44 to recover the CLOCK signal from the Simple Code, and also is input to a decode circuit 46. Three phases of the CLOCK signal —90°, 270° and 360°—from the clock generator 44 are input to the decode circuit 46, and the decode circuit outputs a positive pulse signal and a negative pulse signal. The positive and negative pulse signals from the decode circuit 46 are combined via a resistive summing network at the input of an output buffer amplifier 48 to produce a bipolar signal that is a reproduction of the bipolar signal input to the transmitter of FIG. 3.

Figure 6:
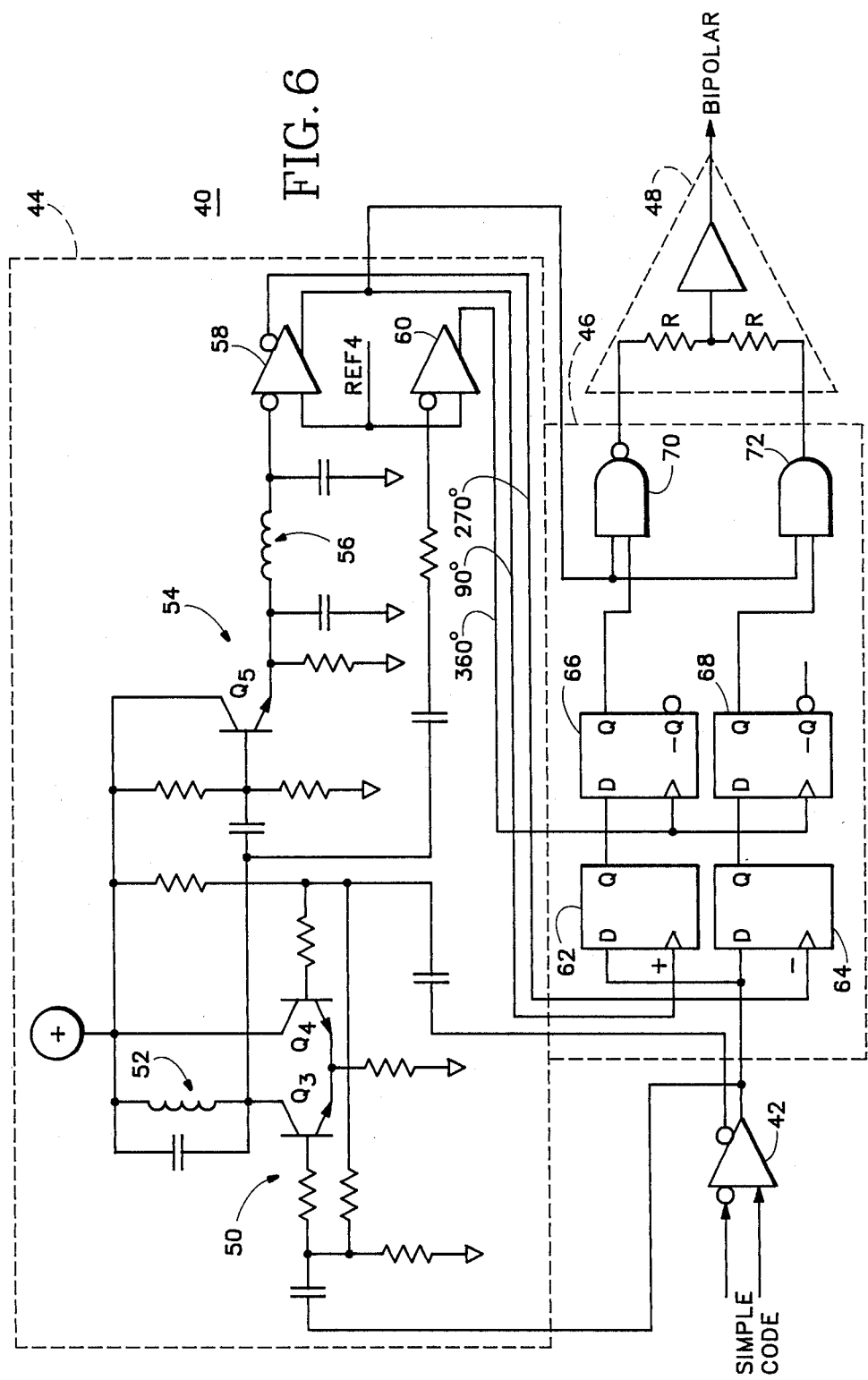
FIG. 6 is a schematic diagram for the decoder of FIG. 5.

The differential Simple Code from the transmitter output buffer amplifier 38 is input to the input buffer amplifier 42 at the receiver 40 as shown in FIGS. 5 and 6. The differential Simple Code output from the input amplifier 42 is a.c. coupled to an oscillator 50 having transistors Q3, Q4, a resistive biasing network and an LC tank circuit 52 in the collector circuit of Q3. The differential Simple Code input to the clock generator 44 serves to synchronize the oscillator 50. The sinusoidal output of the oscillator 50 is a.c. coupled to an oscillator buffer amplifier 54 having a transistor Q5 with appropriate biasing resistors and an output delay network 56. The delayed sinusoidal clock from the delay network 56 is input to a fourth comparator 58 while an undelayed sinusoidal clock is a.c. coupled to a fifth comparator 60.

The comparators 58, 60 have a fourth reference voltage REF4 as a comparison input to convert the sinusoidal clocks into square wave clocks. The output of the fourth comparator 58 is a differential delayed CLOCK signal providing the 90° and 270° phases, and the output of the fifth comparator 60 is an undelayed, or 360° phase, CLOCK signal.

One of the Simple Code outputs from the input amplifier 42 is input to a pair of D-type flip-flops 62, 64 in the decode circuit 46. One of the flip-flops is clocked by the 90° CLOCK signal and the other is clocked by the 270° CLOCK signal from the delay comparator 58. The Q outputs of the pair of flip-flops are input to a second pair of D-type flip-flops 66, 68. The second pair of flip-flops are clocked simultaneously by the undelayed CLOCK signal from the comparator 60. The /Q output of one flip-flop 66 of the second pair is input to a NAND gate 70 and the Q output of the other flip-flop 68 of the second pair is input to an AND gate 72. The other input to the NAND gate 70 and to the AND gate 72 is the 90° CLOCK signal. The NAND gate 70 outputs a negative pulse signal corresponding to the −PULSE signal at the encoder, and the AND gate 72 outputs a positive pulse signal corresponding to the +PULSE signal at the encoder. The outputs of the NAND gate 70 and the AND gate 72 are input to the resistive summing network at the input to the output buffer amplifier 48, which preferably is a multifunction amplifier such as the one described in U.S. Pat. No. 4,799,026 that combines the positive and negative pulse binary signals via a resistive summing network at the input and provides appropriate buffering and impedance matching The output of the output amplifier 48 is the reconstructed bipolar signal.

In operation the delayed CLOCK signal from the delay comparator 58 as applied to the first set of flip-flops 62, 64 samples the Simple Code input twice per CLOCK period The delay assures that the sampling occurs after the pulse transition edges of the Simple Code to eliminate any ambiguities If the value of the Simple Code during a CLOCK period is the same for both flip-flops 62, 64, then the output value is either negative or positive depending upon whether the Simple Code was low or high. If the value of the Simple Code alternates during the CLOCK period, then the output values of the flip-flops 62, 64 will be different, indicating a zero value. The data from the flip-flops 62, 64 is transferred to the second pair of flip-flops 66, 68 by the next CLOCK signal from comparator 60, again to avoid any ambiguities that would be caused if the transfer occurred simultaneously with the change of state of the preceding flip-flop pair. The resulting positive and negative pulse signals from the second pair of flip-flops 66, 68 are combined by the output amplifier 48 to produce the ternary signal according to the above described scheme.

Thus the present invention provides a Simple Code encoder/decoder for converting a ternary, or bipolar, signal into a binary signal for digital processing by combining a +PULSE signal derived from the +1 value of the bipolar signal with a −PULSE signal derived from the −1 value of the bipolar signal and a CLOCK signal derived from the bipolar signal such that the binary Simple Code is high for +1 values, low for −1 values and alternates high/low for zero values.

WHAT IS CLAIMED IS:

1. A method for converting a ternary signal on a signal input line into a binary signal comprising the steps of:
   generating a high value for the binary signal when the value of the ternary signal is positive;
   generating a low value for the binary signal when the value of the ternary signal is negative; and
   generating an alternating high/low signal for the binary signal when the value of the ternary signal is zero.

2. A method for converting a ternary signal having a strong clock component into a binary signal comprising the steps of:
   extracting from the ternary signal a clock signal, a positive pulse signal corresponding to the positive values of the ternary signal, and a negative pulse signal corresponding to the negative values of the ternary signal;
   combining the positive pulse signal with the clock signal to produce an intermediate binary signal; and
   combining the intermediate binary signal with the negative pulse signal to produce the binary signal such that the binary signal has a high value for each positive value of the ternary signal, a low value for each negative value of the ternary signal, and an alternating high/low value for each zero value of the ternary signal.

3. An apparatus for converting a ternary signal having a strong clock component into a binary signal comprising:
   means for extracting from the ternary signal a clock signal, a positive pulse signal corresponding to the positive values of the ternary signal, and a negative pulse signal corresponding to the negative values of the ternary signal;
   means for combining the positive pulse signal with the clock signal to produce an intermediate binary signal; and
   means for combining the negative pulse signal with the intermediate binary signal to produce the binary signal such that the binary signal has a high value for each positive value of the ternary signal, a low value for each negative value of the ternary signal, and an alternating high/low value for each zero value of the ternary signal.

4. An apparatus as recited in claim 3 wherein the extracting means comprises:
   means for separating the ternary signal into intermediate positive and negative pulse signals and into a synchronizing pulse signal;
   means for adjusting the pulse widths of the pulses of the intermediate positive and negative pulse signals to produce the positive and negative pulse signals in response to the clock signal; and
   means for generating the clock signal in synchronization with the synchronizing pulse signal.

5. A method for converting a binary signal into a ternary signal on a single output line comprising the steps of:
   generating a positive value for the ternary signal when the binary signal is high for a clock period;
   generating a negative value for the ternary signal when the binary signal is low for the clock period; and
   generating a zero value for the ternary signal when the binary signal alternates high/low during the clock period.

6. A method for converting a binary signal having a strong clock component into a ternary signal comprising the steps of:
   generating from the binary signal a clock signal;
   decoding the binary signal into a positive and a negative pulse signal using the clock signal; and
   combining the positive and negative pulse signals to produce the ternary signal such that the ternary signal is positive when the binary signal is high for a period of the clock signal, is negative when the binary signal is low for the period of the clock signal, and is zero when the binary signal alternates high/low during the period of the clock signal.

7. An apparatus for converting a binary signal having a strong clock component into a ternary signal comprising:
   means for generating a clock signal from the binary signal;
   means for decoding the binary signal into a positive and a negative pulse signal using the clock signal; and
   means for combining the positive and negative pulse signals to produce the ternary signal such that the ternary signal is positive when the binary signal is high for a period of the clock signal, is negative when the binary signal is low for the period of the clock signal, and is zero when the binary signal alternates high/low during the period of the clock signal.

* * * * *